US008509458B2

(12) United States Patent
Nakamura et al.

(10) Patent No.: US 8,509,458 B2
(45) Date of Patent: Aug. 13, 2013

(54) PORTABLE ELECTRONIC APPARATUS AND SOUND OUTPUT-CONTROLLING PROGRAM

(75) Inventors: Atsushi Nakamura, Tokyo (JP); Shigeo Morimoto, Tokyo (JP)

(73) Assignee: Kabushiki Kaisha Tohsiba, Tokyo (JP)

( * ) Notice: Subject to any disclaimer, the term of this patent is extended or adjusted under 35 U.S.C. 154(b) by 1077 days.

(21) Appl. No.: 11/850,491

(22) Filed: Sep. 5, 2007

(65) Prior Publication Data

US 2008/0240461 A1 Oct. 2, 2008

(30) Foreign Application Priority Data

Mar. 30, 2007 (JP) .................................. 2007-91259

(51) Int. Cl.
*H03G 3/00* (2006.01)

(52) U.S. Cl.
USPC .......................................................... 381/107

(58) Field of Classification Search
USPC ............................ 381/123; 455/569.1, 456.4
See application file for complete search history.

(56) References Cited

U.S. PATENT DOCUMENTS 7,469,155 B2 * 12/2008 Chu ............................. 455/567
7,522,065 B2 * 4/2009 Falcon ....................... 340/686.6
7,864,163 B2 * 1/2011 Ording et al. ................. 345/173
2005/0110914 A1 * 5/2005 Lee .............................. 348/838
2005/0265565 A1 * 12/2005 Sakemoto et al. ............ 381/123
2006/0223547 A1 * 10/2006 Chin et al. ................. 455/456.1
2006/0229114 A2 * 10/2006 Kim ........................... 455/575.1
2006/0245734 A1 11/2006 Amano et al.
2009/0064055 A1 * 3/2009 Chaudhri et al. ............. 715/863

FOREIGN PATENT DOCUMENTS

JP 2004128812 4/2004
JP 2004-217192 8/2004
JP 2005-110044 4/2005
JP 200534111 12/2005
JP 2006140866 6/2006
JP 2006140866 A * 6/2006
JP 2006-309880 11/2006
JP 2007-005853 1/2007

OTHER PUBLICATIONS

Japanese Office Action dated Dec. 20, 2011.

* cited by examiner

*Primary Examiner* — Mohammad Islam
*Assistant Examiner* — David Ton
(74) *Attorney, Agent, or Firm* — Pillsbury Winthrop Shaw Pittman, LLP

(57) ABSTRACT

Information on a use situation of a portable electronic apparatus possessed by a user is acquired from an illuminance sensor, a contact sensor, and a GPS portion as use situation-acquiring portions, and a volume of a sound outputted either to a speaker provided as an internal sound-outputting unit in the portable electronic apparatus or to an external sound-outputting unit such as a headphone is controlled in accordance with the acquired information. Thus, even when a plug of the headphone falls off from the portable electronic apparatus despite an intention of the user, an unpleasant sound is prevented from being outputted from the speaker to a circumference.

1 Claim, 14 Drawing Sheets

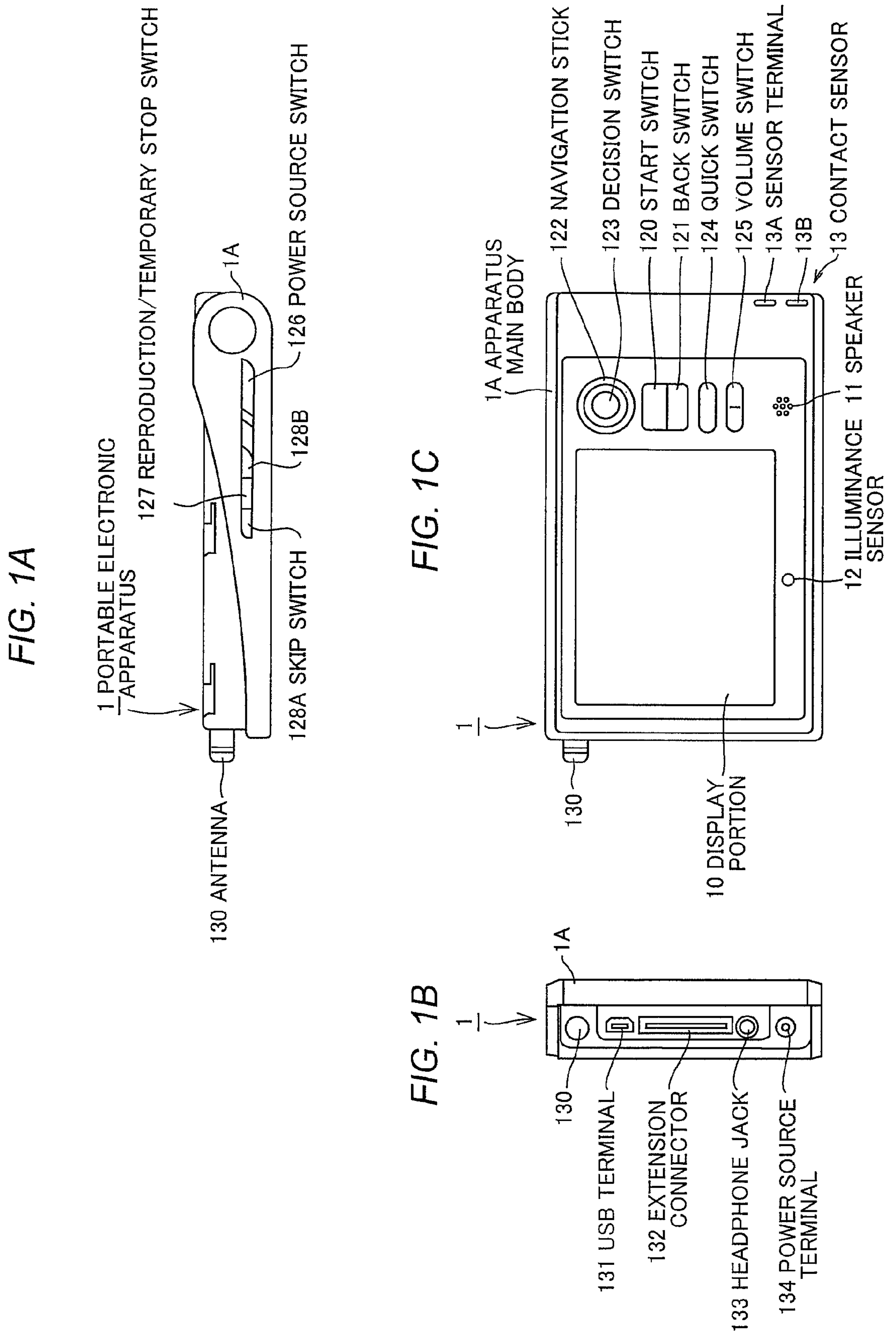
FIG. 1A
1 PORTABLE ELECTRONIC APPARATUS
127 REPRODUCTION/TEMPORARY STOP SWITCH
126 POWER SOURCE SWITCH
1A
128B
128A SKIP SWITCH
130 ANTENNA
FIG. 1C
1A APPARATUS MAIN BODY
122 NAVIGATION STICK
123 DECISION SWITCH
120 START SWITCH
121 BACK SWITCH
124 QUICK SWITCH
125 VOLUME SWITCH
13A SENSOR TERMINAL
13B
13 CONTACT SENSOR
11 SPEAKER
12 ILLUMINANCE SENSOR
10 DISPLAY PORTION
130
1
FIG. 1B
1
1A
130
131 USB TERMINAL
132 EXTENSION CONNECTOR
133 HEADPHONE JACK
134 POWER SOURCE TERMINAL

FIG. 11A

| USE SITUATION DATA | EFFECTIVE/ NON-EFFECTIVE | DEGREE OF PRIORITY |
|---|---|---|
| GPS PORTION | EFFECTIVE | 2 |
| ILLUMINANCE SENSOR | NON-EFFECTIVE | |
| CONTACT SENSOR | EFFECTIVE | 1 |

FIG. 11B

| USE SITUATION DATA | EFFECTIVE/ NON-EFFECTIVE | DEGREE OF PRIORITY |
|---|---|---|
| GPS PORTION | EFFECTIVE | 1 |
| ILLUMINANCE SENSOR | EFFECTIVE | 2 |
| CONTACT SENSOR | NON-EFFECTIVE | |

FIG. 12

| DATA | VOLUME |
|---|---|
| MOVING IMAGE | 3 |
| MUSIC | 2 |
| TV IMAGE | 4 |

PORTABLE ELECTRONIC APPARATUS AND SOUND OUTPUT-CONTROLLING PROGRAM

The present application is based on Japanese patent application No. 2007-091259, the entire contents of which are incorporated herein by reference.

BACKGROUND

1. Field

One embodiment of the invention relates to a portable electronic apparatus and a sound output-controlling program.

2. Description of the Related Art

A portable electronic apparatus which switches a sound over to another one and controls a volume in accordance with a connection state between a sound outputting unit such as a headphone or an earphone and an apparatus main body is known as conventional one. This portable electronic apparatus, for example, is described in the Japanese Patent Kokai No. 2005-341111.

The portable electronic apparatus described in the Japanese Patent Kokai No. 2005-341111 includes a connector which is provided in a chassis and to which a sound outputting unit is connected, and a controller for detecting connection between the connector and the sound outputting unit. When detecting that the sound outputting unit such as a headphone or an earphone is connected to the connector, the controller switches an output destination of a sound from a built-in speaker over to the sound outputting unit, and changes a volume of a sound which is outputted from the sound outputting unit to another suitable one.

According to the portable electronic apparatus described in the Japanese Patent Kokai No. 2005-341111, even when the sound outputting unit is connected to the connector in a state in which the large volume is set for the sound, an excessive load is prevented from being applied to each of ears of a user because the controller controls the volume of the sound outputted from the sound outputting unit.

In addition, a portable electronic apparatus which, when an output destination of a sound is switched from a sound outputting unit such as a headphone or an earphone over to a speaker built therein, controls a volume of the sound outputted from the speaker is known as another conventional one. This portable electronic apparatus, for example, is described in the Japanese Patent Kokai No. 2006-140866.

The portable electronic apparatus described in the Japanese Patent Kokai No. 2006-140866 includes a detecting portion for detecting a connection state between a plug of a headphone and a headphone jack, and a volume controlling portion for controlling a volume of a sound outputted either from the speaker or from the headphone. In the case where a volume of the sound is higher in level than a reference volume when the plug of the headphone falls off from the headphone jack, after reducing the volume of the sound outputted from the speaker in level to a reference volume, the volume controlling portion gradually increases the volume of the sound outputted from the speaker.

According to the portable electronic apparatus described in the Japanese Patent Kokai No. 2006-140866, even when the plug of the headphone is pulled out from the headphone jack while a user listens to a sound of a program with the set large volume by using the headphone, the sound having the large volume is prevented from being outputted from the speaker.

However, each of the portable electronic apparatuses described in the Japanese Patent Kokai Nos. 2005-34111 and 2006-140866, respectively, involves a problem that the volume cannot be minutely set in accordance with a use environment of the portable electronic apparatus although the volume is controlled in accordance with the connection state between the portable electronic apparatus and the sound outputting unit. In the case of a compact portable electronic apparatus having excellent portability, it is supposed that the compact portable electronic apparatus is used in the various situations, including the interior of a house and the exterior of a house. There is the possibility that the plug of the headphone unexpectedly falls off from the headphone jack despite an intention of a user, so that the sound is outputted from the speaker to the circumference. However, such a case may be undesirable depending on the situations.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIGS. 1A, 1B and 1C are respectively an exemplary top plan view, an exemplary side elevational view, and an exemplary front view of an apparatus main body of a portable electronic apparatus according to an embodiment of the invention;

FIGS. 11A and 11B are respectively an exemplary diagram of a table showing the degree of priority for use situation data in a situation (effective) in which both a GPS portion and a contact sensor are operated, and an exemplary diagram of a table showing the degree of priority for use situation data in a situation (effective) in which both the GPS portion and an illuminance sensor are operated;

FIG. 12 is an exemplary diagram of a table showing a volume setting made in correspondence to kinds of contents each of which can be reproduced in the portable electronic apparatus according to the embodiment of the invention;

DETAILED DESCRIPTION OF PREFERRED EMBODIMENTS

Figure 2:
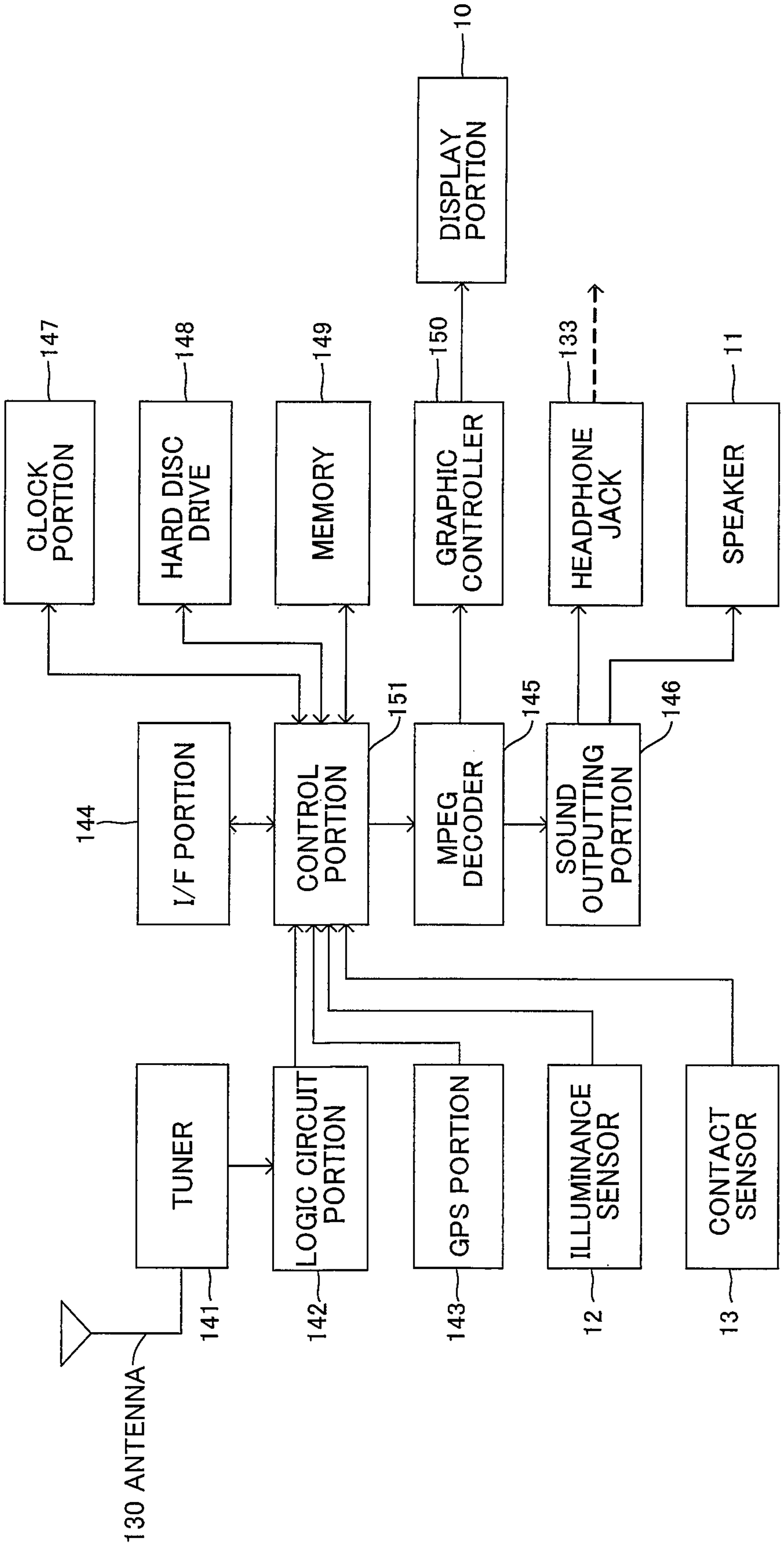
FIG. 2 is an exemplary block diagram schematically showing a configuration of the portable electronic apparatus according to the embodiment of the invention.

Various embodiments according to the invention will be described hereinafter with reference to the accompanying drawings. In general, according to one embodiment of the invention, there is provided a portable electronic apparatus, including: a sound outputting portion for outputting a sound either to an external sound-outputting unit connected to an apparatus main body or to an internal sound-outputting unit provided in the apparatus main body; a use situation-acquiring portion for acquiring information in accordance with which an output of the sound is controlled in correspondence to a use situation of the apparatus main body; and a control portion for detecting connection between the external sound-outputting unit and the apparatus main body, and separation of the external sound-outputting unit from the apparatus main body; in which when detecting one of the connection between the external sound-outputting unit and the apparatus main body, and the separation of the external sound-outputting unit from the apparatus main body, the control portion controls a volume of the sound in accordance with the information acquired by the use situation-acquiring portion.

In addition, according to a further embodiment of the invention, there is provided a portable electronic apparatus, including: a sound outputting portion for outputting a sound either to an external sound-outputting unit connected to an apparatus main body or to an internal sound-outputting unit provided in the apparatus main body; a plurality of use situation-acquiring portions for acquiring information in accordance with which an output of the sound is controlled in correspondence to a use situation of the apparatus main body; a storage portion for storing therein set values for volumes of the sound outputted either from the external sound-outputting unit or from the internal sound-outputting unit; and a control portion for detecting connection between the external sound-outputting unit and the apparatus main body, and separation of the external sound-outputting unit from the apparatus main body; in which when detecting one of the connection between the external sound-outputting unit and the apparatus main body, and separation of the external sound-outputting unit from the apparatus main body, the control portion controls the volume of the sound in accordance with the information acquired by at least one of the plurality of use situation acquiring portions by referring to the set values stored in the storage portion.

Also, according to a still further embodiment of the invention, there is provided a sound output-controlling program for, in order to control an output of a sound, causing a computer to function in a form of an apparatus, the apparatus including: a sound outputting portion for outputting a sound either to an external sound-outputting unit connected to an apparatus main body or to an internal sound-outputting unit provided in the apparatus main body; a use situation-acquiring portion for acquiring information in accordance with which an output of the sound is controlled in correspondence to a use situation of the apparatus main body; and a control portion for detecting connection between the external sound-outputting unit and the apparatus main body, and separation of the external sound-outputting unit from the apparatus main body, and when detecting one of the connection between the external sound-outputting unit and the apparatus main body, and the separation of the external sound-outputting unit from the apparatus main body, controlling a volume of the sound in accordance with the information acquired by the use situation-acquiring portion.

According to the embodiments of the invention, the volume of the sound can be controlled in accordance with the use situation of the portable electronic apparatus.

A preferred embodiment of the invention will be described in detail hereinafter with reference to the accompanying drawings.

(Portable Electronic Apparatus)

FIGS. 1A, 1B and 1C are respectively an exemplary top plan view, an exemplary side elevational view, and an exemplary front view of an apparatus main body of a portable electronic apparatus according to an embodiment of the invention.

The portable electronic apparatus 1 includes, in its inside, electronic units such as a central processing unit (CPU), a tuner for receiving a one-segment broadcasting as a ground digital television broadcasting which is intended for reception by portable electronic apparatuses, and a compact hard disc drive (HDD). The portable electronic apparatus 1 has a size and a weight which are enough for the portability. Also, the front of the portable electronic apparatus 1 is provided with a display portion 10 for displaying thereon an image of characters and the like, and a video of the one-segment broadcasting, a speaker 11, as an internal sound-outputting unit, for outputting a sound, an illuminance sensor 12 for detecting an illuminance of the circumference of the portable electronic apparatus 1, a contact sensor 13 provided on a surface of the apparatus main body 1A of the portable electronic apparatus 1 for detecting contact of a user with the contact sensor 13, and a main part of a group of manipulating switches with which the portable electronic apparatus 1 is manipulated. The remaining manipulating switches are provided on a top face of the portable electronic apparatus 1.

The main part of the group of manipulating switches includes a start switch 120 which is provided in a front face of the portable electronic apparatus 1, and with which a start image is displayed on a display portion 10 of the portable electronic apparatus 1, a back switch 121 with which a picture displayed the last time by the last manipulation is displayed on the display portion 10, a navigation stick 122 which is provided manipulatably in four directions and with which desired ones of the menus and items displayed on the screen of the display portion 10 are selected, a decision switch 123 which is provided at a central portion of the navigation stick 122 and with which a decision manipulation about the objects such as the selected menu and item is performed, a quick switch 124 with which an operation for activation for reception of the one-segment broadcasting is performed or a quick menu is displayed on the display portion 10, and a volume switch 125 with which a manipulation for adjusting a volume is performed.

In addition, a power source switch 126 with which a manipulation for a power source, and switch lock are performed, a reproduction/temporary stop switch 127, and skip switches 128A and 128B are provided as the remaining manipulation switches on the top face of the portable electronic apparatus 1.

Also, a side face (a left-hand side face when viewed from the front) of the portable electronic apparatus 1 is provided with a extensible antenna 130, a universal serial bus (USB)

terminal 131, an extension connector 132 through which the portable electronic apparatus 1 is connected to an apparatus such as an external monitor, a headphone jack 133 through which an earphone or a headphone as an external sound-outputting unit is connected to the portable electronic apparatus 1, and a power source terminal 134 through which a power is supplied from the outside to the portable electronic apparatus 1.

The display portion 10 includes a color liquid crystal panel on which a color picture can be displayed, and a back light unit which is provided on a back face of the color liquid crystal panel which performs transmission illumination for a liquid crystal display surface. A brightness of the back light unit can be adjusted by an electrical signal corresponding to an illuminance obtained from the illuminance sensor 12 which will be described below.

The illuminance sensor 12 outputs the electrical signal corresponding to a quantity of light radiated to its light receiving surface. A phototransistor or a photodiode can be used as such an illuminance sensor 12. In this embodiment, an inexpensive phototransistor which outputs a large current is used as the illuminance sensor 12.

The contact sensor 13 detects whether or not the user touches the apparatus main body 1A of the portable electronic apparatus 1 in accordance with conduction caused between sensor terminals 13A and 13B. In this embodiment, a touch sensor in which conduction is caused between an electrical terminal and the GND through touch of a hand of a user to a sensor surface is used as the contact sensor 13.

FIG. 2 is a block diagram schematically showing the portable electronic apparatus according to the embodiment of the invention.

The portable electronic apparatus 1 includes a tuner 141 for converting an electric wave about broadcasting data received at the antenna 130 into digital data having a transport stream (TS) format, a logic circuit portion 142 for executing processing for removing unnecessary data portion from the digital data having the TS format, and acquiring a program clock reference (PCR) by analyzing the digital data having the TS format inputted thereto from the tuner 141, a global positioning system (GPS) portion 143 for outputting position detection information obtained from the GPS as information on a use situation of the portable electronic apparatus 1, the illuminance sensor 12 for outputting an illuminance signal corresponding to the illuminance as the information on the use situation of the portable electronic apparatus 1, the contact sensor 13 for outputting an electrical signal, obtained in accordance with the contact state of the human body with the apparatus main body 1A, in the form of information on the use situation of the portable electronic apparatus 1, an I/F portion 144 having terminals, such as a USB terminal portion and a video terminal portion, through which the portable electronic apparatus 1 is connected to an external apparatus, an MPEG decoder 145 for separating the digital data having the TS format into data such as audio data and video data, and decoding the resulting data, thereby generating a video signal and graphic data, a sound outputting portion 146, as a digital/analog converter for converting the digital audio signal having the audio data and the video data into an analog audio component, a clock portion 147 as an internal clock of the portable electronic apparatus 1, a hard disc drive 148 for storing therein a program of the portable electronic apparatus 1, the data such as the audio data and the video data, and set values for a headphone volume and a speaker volume, a memory 149 such as an SRAM provided as a temporary storage portion, a graphic controller 150 for composing the video signal and the graphic data obtained in the MPEG decoder 145, outputting the composite data to the display portion 10, and adjusting a brightness and a contrast of a displayed picture, and a control portion 151 for controlling all the portions shown in FIG. 2 except for the antenna 130, and corresponding portions (not shown) of the portable electronic apparatus 1, and controlling a volume of a sound originated from an audio signal outputted from the sound outputting portion 146 by monitoring output signals from the GPS portion 143, the illuminance sensor 12, and the contact sensor 13 in the form of information on the use situation of the portable electronic apparatus 1.

(Structure pf Software)

Figure 3:
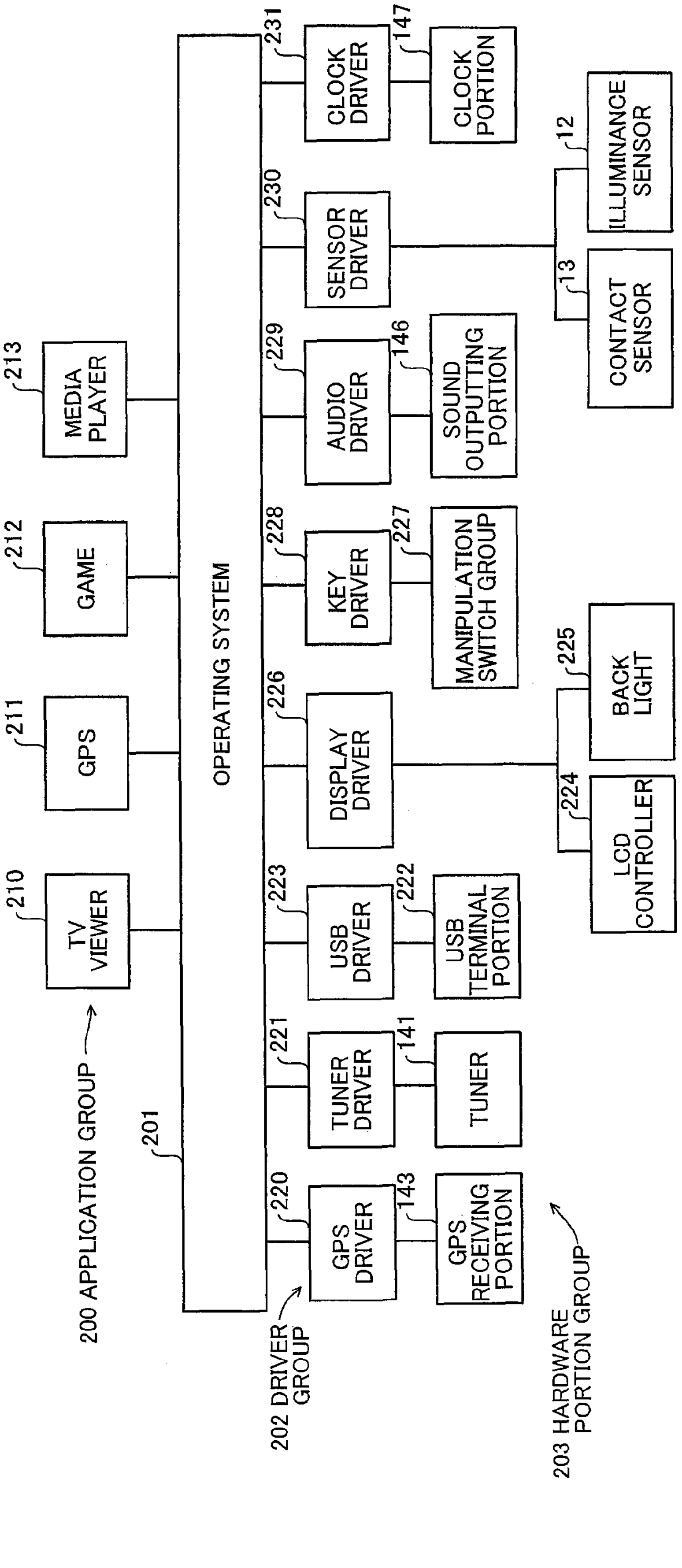
FIG. 3 is an exemplary block diagram schematically showing a system of software and hardware portions of the portable electronic apparatus according to the embodiment of the invention.

FIG. 3 is a block diagram schematically showing a system of software and the hardware portions of the portable electronic apparatus according to the embodiment of the invention.

The software includes an application group 200, an operating system 201, and a driver group 202. Also, the hardware portions of a hardware portion group 203 are connected so as to correspond to the drivers, respectively.

The application group 200 includes a TV viewer 210 for processing reception and picture display of a one-segment broadcasting, a GPS 211 for grasping a position of the portable electronic apparatus 1 by receiving an electric wave from a satellite, and displaying information on the grasped position of the portable electronic apparatus 1, a game 212 which can execute various kinds of game software, and a media player 213 which can reproduce and record an audio file and a video file.

The operating system 201 controls each of the application group 200 and the driver group 202 in accordance with predetermined settings and a function selected by the user.

The driver group 202 includes a GPS driver 220 for driving the GPS portion 143, a tuner driver 221 for driving the tuner 141, a USB driver 223 for driving a USB terminal portion 222, a display driver 226 for driving each of a liquid crystal display (LCD) controller 224 and the back light 225, a key driver 228 for managing the group of manipulating switches 227 provided in the portable electronic apparatus 1, an audio driver 229 for driving the sound outputting portion 146, a sensor driver 230 for driving each of the illuminance sensor 12 and the contact sensor 13, and a clock driver 231 for driving the clock portion 147.

Figure 4:
FIG. 4 is an exemplary schematic view showing a first use situation of the portable electronic apparatus according to the embodiment of the invention.

FIG. 4 is a schematic view showing a first use situation of the portable electronic apparatus according to the embodiment of the invention.

Even when the portable electronic apparatus 1 is accommodated in a bag 20 as shown in FIG. 4, the user can listen to a sound outputted from a headphone 2 connected as an external sound-outputting unit to the portable electronic apparatus 1 through the headphone jack 133. Since the bag 20 is darker in its inside than in the outside of the bag 20, a level of the output signal received by the illuminance sensor 12 in the bag 20 is lower than that of the output signal received by the illuminance sensor 12 in a light place in accordance with a quantity of light. When the level of the quantity of light received by the illuminance sensor 12 becomes lower than a certain level, the volume of the sound outputted from the headphone 2 is made lower in level than normal one or mute is set, which results in that even when the portable electronic apparatus 1 and the headphone 2 are separated from each other despite an intention of the user, an unpleasant speaker output can be prevented from being generated.

Note that, for example, the setting can also be made for the portable electronic apparatus 1 so that the volume of the sound from the speaker 11 is controlled in accordance with a difference in illuminance between day and night, irrespective of the situation in which the portable electronic apparatus 1 is accommodated in a light shielding body such as the bag 20 described above.

Figure 5:
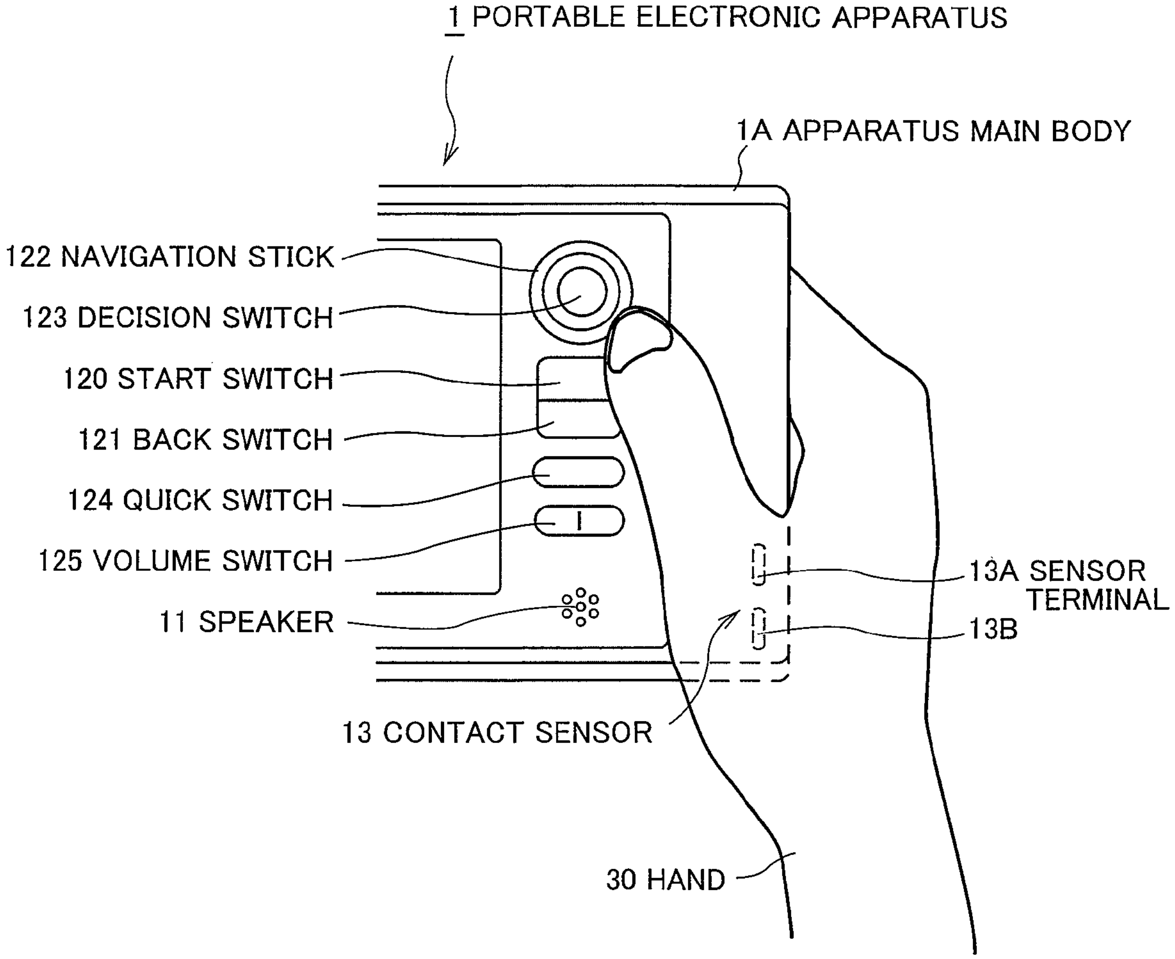
FIG. 5 is an exemplary schematic view showing a second use situation of the portable electronic apparatus according to the embodiment of the invention.

FIG. 5 is a schematic view showing a second use situation of the portable electronic apparatus according to the embodiment of the invention.

The portable electronic apparatus 1 is constituted such that when the user holds the apparatus main body 1A with his/her hand 30 as shown in the figure, a part of the hand 30 contacts the contact sensor 13. The conduction is caused between the sensor terminals 13A and 13B through the contact of the part of the hand 30 with the contact sensor 13, which results in that a weak current is caused to flow through a sensor circuit built in the portable electronic apparatus 1. Thus, the sensor circuit detects that the user contacts the portable electronic apparatus 1 in accordance with the weak current caused to flow therethrough.

Figure 6A:
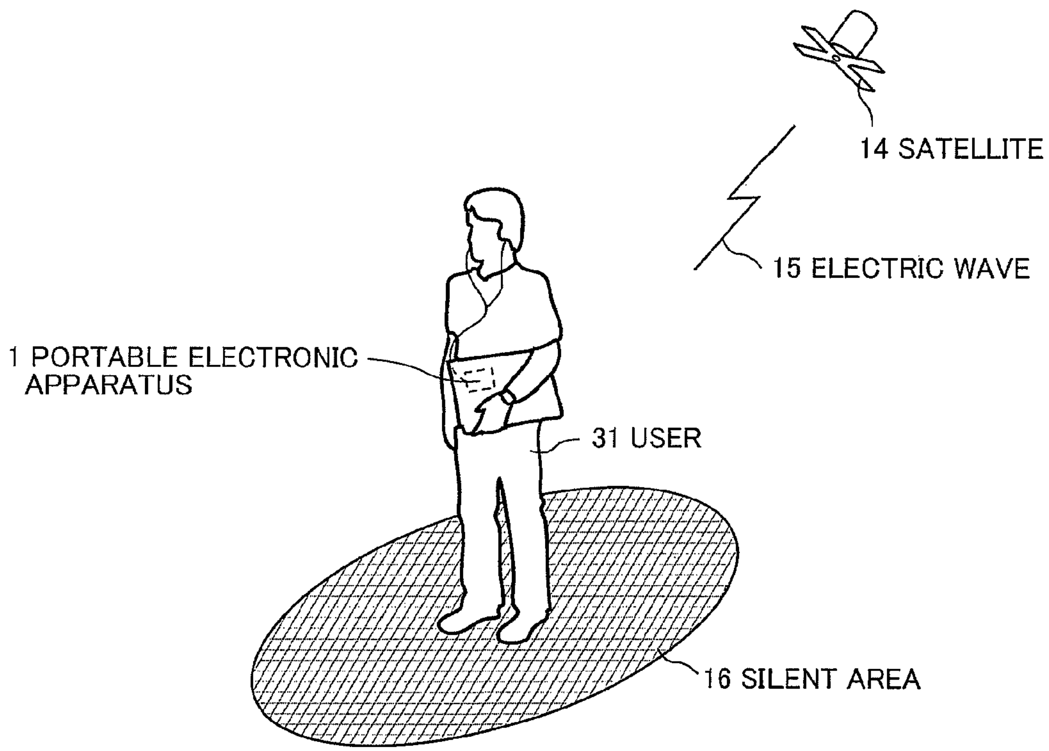
FIGS. 6A and 6B are respectively exemplary schematic views each showing a third use situation of the portable electronic apparatus according to the embodiment of the invention.
Figure 6B:
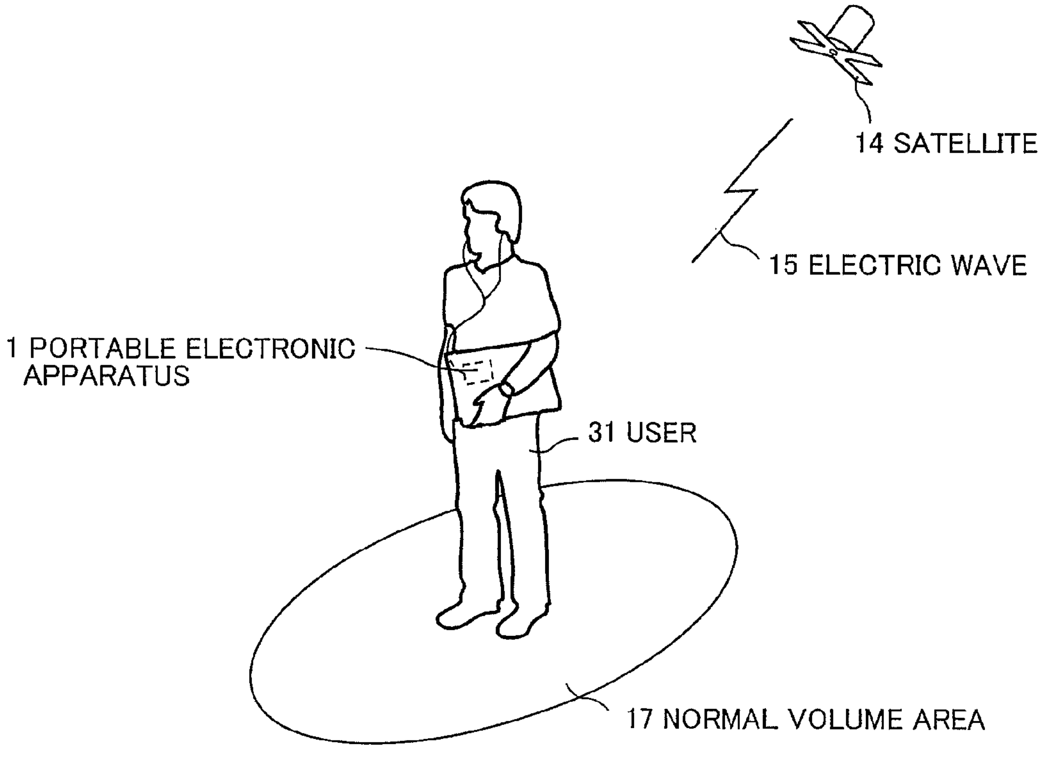

FIGS. 6A and 6B are respectively schematic views each showing a third use situation of the portable electronic apparatus according to the embodiment of the invention.

The portable electronic apparatus 1 can adjust the volume in accordance with the position detection information by making the GSP function effective. For example, when the control portion 151 judges that the portable electronic apparatus 1 possessed by a user 31 is located within a previously registered area in accordance with the position information obtained from the GPS, the sound outputting portion 146 can mute the sound output from the speaker 11.

FIG. 6A shows the case where the control portion 151 judges that the portable electronic apparatus 1 is located within an area in which the sound outputted from the speaker 11 is to be muted (a silent area 16) in accordance with an electric wave 15 received from a satellite 14. When the control portion 151 detects the separation of the headphone 2 from the headphone jack 133 in the case where the setting described above is previously made, the sound outputting portion 146 controls the speaker 11 so that the sound output from the speaker 11 is muted.

FIG. 6B shows the case where the control portion 151 judges that the portable electronic apparatus 1 is located within a normal volume area 17 in accordance with the electric wave 15 received from the satellite 14. When the control portion 151 detects the separation of the headphone 2 from the headphone jack 133 in the case where the setting as described above is previously made, the sound outputting portion 146 controls the speaker 11 so that the sound output from the speaker 11 has a predetermined volume.

Figure 7:
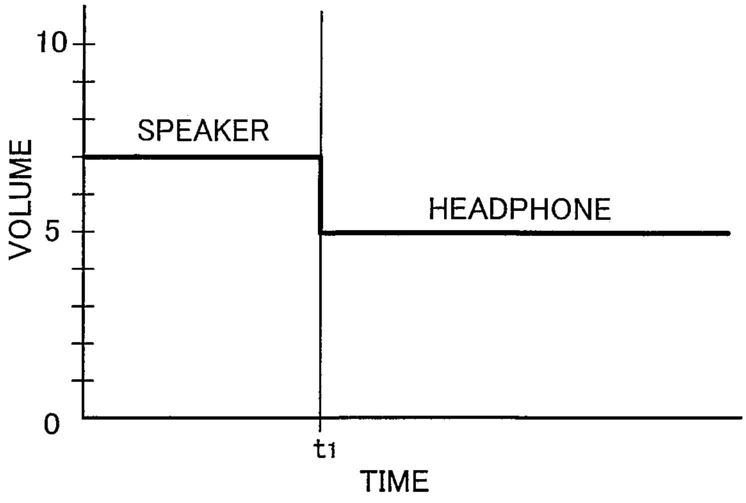
FIG. 7 is an exemplary graphical representation showing a volume setting for the portable electronic apparatus according to the first embodiment of the invention.

FIG. 7 is a graphical representation showing a volume setting for the portable electronic apparatus according to the embodiment of the invention. Here, in the following description, the volume level of the sound originating from the audio data which can be reproduced by the portable electronic apparatus 1 is set at ten steps.

The portable electronic apparatus 1 can set the volume every sound output destination. When a plug of the headphone 2 is plugged into the headphone jack 133 of the portable electronic apparatus 1 at a time t1 as shown in the figure, the sound outputting portion 146 switches the sound output from the speaker 11 over to the headphone 2, and changes the current volume to another suitable one. In this case shown in FIG. 7, the sound outputting portion 146 changes the volume from a speaker volume at a level of 7 to a headphone volume at a level of 5.

FIGS. 8A and 8B to FIG. 10 are respectively graphical representations showing other volume settings for the portable electronic apparatus according to the embodiment of the invention.

When the control portion 151 detects the separation of the headphone 2 from the headphone jack 133 of the portable electronic apparatus 1 at a time t1 as shown in each of FIGS. 8A and 8B, and FIGS. 9A and 9B, the sound outputting portion 146 switches the sound output from the headphone 2 over to the speaker 11, and changes the current volume to another suitable one.

Figure 8A:
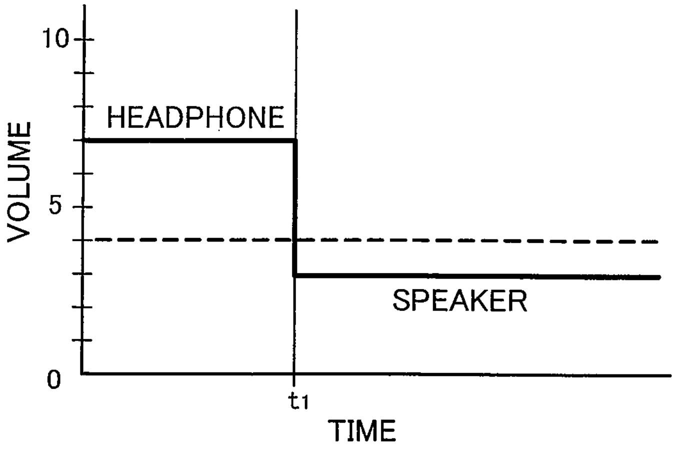
FIGS. 8A and 8B are respectively an exemplary graphical representation showing changing of a volume when a reference volume is previously set, and an exemplary graphical representation showing changing of a volume when a mute setting is made.

FIG. 8A is a graphical representation showing changing of the volume when a reference volume is previously set. The reference volume is one which is set for the purpose of preventing the speaker 11 from being damaged by the sound output having a large volume, and is set at a level of 4 in this case. When the control portion 151 detects the separation of the headphone 2 from the headphone jack 133 of the portable electronic apparatus 1 at the time t1 as shown in FIG. 8A, the sound outputting portion 146 switches the sound output from the headphone 2 over to the speaker 11, and changes the current volume at a level of 7 to the volume at a level of 3 which is one level lower than that of the reference volume.

Figure 8B:
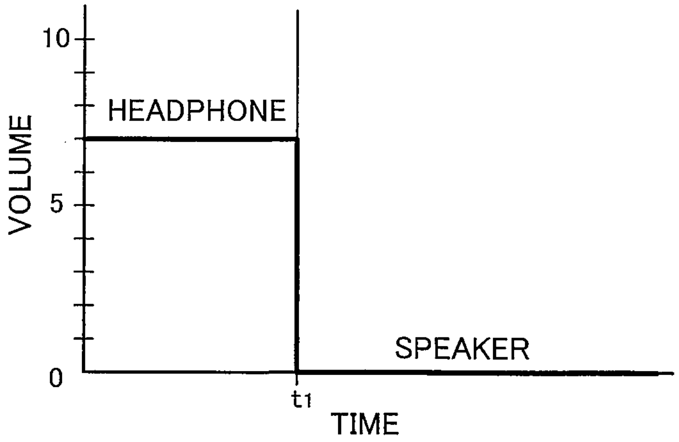

FIG. 8B is a graphical representation showing changing of the volume when a mute setting is made for the speaker. When this setting is made effective, the mute is set for the speaker 11. When the control portion 151 detects the separation of the headphone 2 from the headphone jack 133 of the portable electronic apparatus 1 at the time t1 as shown in FIG. 8B, the sound outputting portion 146 switches the sound output from the headphone 2 over to the speaker 11, and makes the mute setting effective, thereby changing the volume from the volume at a level of 7 over to the mute.

Figure 9A:
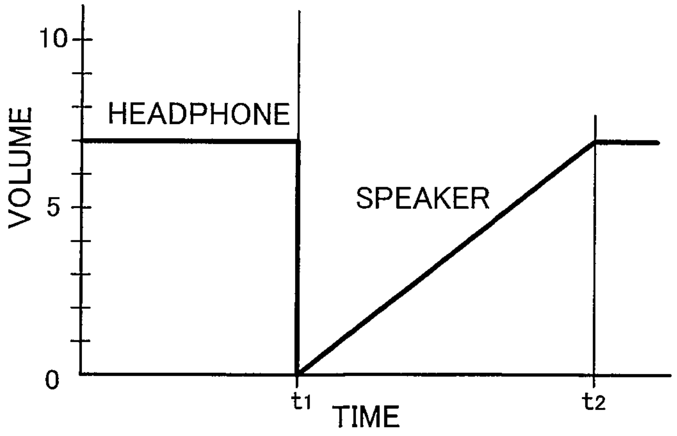
FIGS. 9A and 9B are respectively an exemplary graphical representation showing changing of a volume when a setting is made so that fade-in is obtained after mute is set, and an exemplary graphical representation showing a volume when the volume is set constant.

FIG. 9A is a graphical representation showing changing of the volume when a setting is made so that fade-in is obtained after the mute is set. When this setting is made effective, a fade-in speaker output is set in which after the mute is set, the volume is gradually increased up to one before the mute is set. When the control portion 151 detects the separation of the headphone 2 from the headphone jack 133 of the portable electronic apparatus 1 at a time t1 as shown in FIG. 9A, the sound outputting portion 146 switches the sound output from the headphone 2 over to the speaker 11, and gradually increases the volume of the sound from the speaker 11 after the volume thereof is reduced from the volume at a level of 7 to the mute. Also, the sound outputting portion 146 fixes the volume of the sound from the speaker 11 at a time t2 when the volume thereof reaches the volume at the level of 7.

Figure 9B:
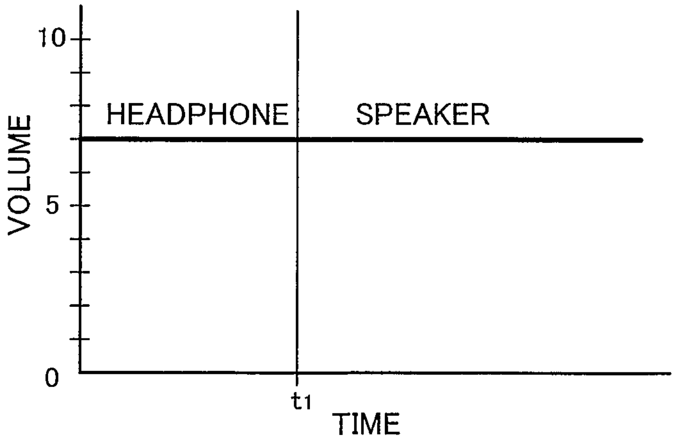

FIG. 9B is a graphical representation showing changing of the volume when a setting is made so as to hold the volume constant. When this setting is made effective, the sound is outputted with a given volume irrespective of the connection of the headphone 2 and the headphone jack 133 of the portable electronic apparatus 1, and the separation of the headphone 2 from the headphone jack 133 of the portable electronic apparatus 1. Here, in the case where the volume is previously set at a level of 7, even when the control portion 151 detects the separation of the headphone 2 from the headphone jack 133 of the portable electronic apparatus 1 at the time t1 as shown in FIG. 9B, the sound outputting portion 146 merely switches the sound output from the headphone 2 over to the speaker 11, and thus changes no volume.

Figure 10:
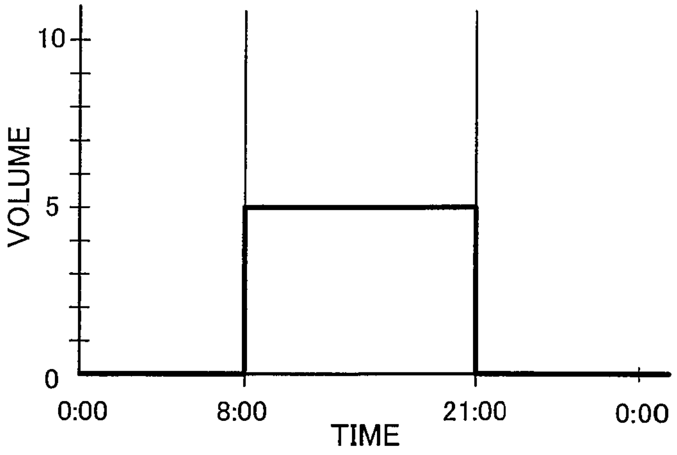
FIG. 10 is a exemplary graphical representation showing a volume when the volume is set so as to be changed with time.

FIG. 10 is a graphical representation showing changing of the volume when a setting is made so as to change the volume with time. When this setting is made effective, the volume can be changed with time. In this case shown in FIG. 10, the mute is set for a period of time from 0:00 to 8:00, the volume is set at a level of 5 for a period of time from 8:00 to 21:00, and the mute is also set for a period of time from 21:00 to 0:00.

FIGS. 11A and 11B are respectively diagrams of tables each showing the degree of priority of use situation data obtained from the corresponding hardware portions for acquiring information on the use situation of the portable electronic apparatus.

In this embodiment, the volume of the sound outputted either to the speaker 11 or to the headphone 2 is controlled in accordance with the use situation data acquired by the GPS portion 143, the illuminance sensor 12, and the contact sensor 13. In the situation in which a plurality of corresponding hardware portions for acquiring the data on the use situation of the portable electronic apparatus 1 are simultaneously used, the control portion 151 of the portable electronic apparatus 1 judges the volume adjustment in accordance with the degree of the priority which is previously set for the use situation data thus acquired. A table in which such a degree of the priority is set is stored in the hard disc drive 148.

FIG. 11A is a diagram of a table showing the degree of the priority for the use situation data in a situation in which both the GPS portion and the contact sensor are operated (effective). In this case, it is assumed that the GPS portion 143 judges that the portable electronic apparatus 1 is located within the silent area, the sound output from the speaker 11 is set to the mute, and the control portion 151 recognizes that the hand of the user touches the apparatus main body 1A of the portable electronic apparatus 1 in accordance with the output signal from the contact sensor 13. According to the degree of the priority which is previously set in the portable electronic apparatus 1, when the output signals from the contact sensor 13 and the GPS portion 143 are simultaneously inputted to the control portion 151, the control portion 151 prioritizes the output signal from the contact sensor 13 over the output signal from the GPS portion 143.

In addition, in the case where no hand of the user touches the apparatus main body 1A of the portable electronic apparatus 1 even when the contact sensor 13 is effective, the control portion 151 makes the setting for the volume adjustment in accordance with the output signal from the GPS portion 143.

FIG. 11B is a diagram of a table showing the degree of the priority for the use situation data in a situation in which both the GPS portion and the illuminance sensor are operated (effective). In this case, it is assumed that the GPS portion 143 judges that the portable electronic apparatus 1 is located within the silent area, the sound output from the speaker 11 is set to the mute, and the control portion 151 recognizes that the light radiated to the apparatus main body 1A of the portable electronic apparatus 1 is shielded by the light shielding body in accordance with the output signal from the illuminance sensor 12. According to the degree of the priority which is previously set in the portable electronic apparatus 1, when the output signals from the illuminance sensor 12 and the GPS portion 143 are simultaneously inputted to the control portion 151, the control portion 151 prioritizes the output signal from the GPS portion 143 over the output signal from the illuminance sensor 12.

In addition, when the portable electronic apparatus 1 is used in such a condition that no electric wave reaches the portable electronic apparatus 1 even when the GPS portion 143 is effective, the control portion 151 makes the setting for the volume adjustment in accordance with the output signal from the illuminance sensor 12.

FIG. 12 is a diagram of a table showing a volume setting made in correspondence to kinds of contents each of which can be reproduced in the portable electronic apparatus according to the embodiment of the invention.

In the portable electronic apparatus 1, the volume of the sound outputted from the speaker 11 when the plug of the headphone 2 falls off from the headphone jack 133 can be previously set every kind of contents. With respect to such a setting of the volume for each kind of contents, the volumes are previously set for extensions for contents data files. Set values for the volumes are stored in the hard disc drive 148. The control portion 151 determines the regenerative volume by referring to the extensions for the contents data files.

Although the volume at the level of 3, the volume at the level of 2, and the volume at the level of 4 are set for the regenerative volume about moving image data, the regenerative volume about music data, and the regenerative volume about a TV video, respectively, as shown in FIG. 12, the invention is not intended to be limited to such settings.

Figure 13:
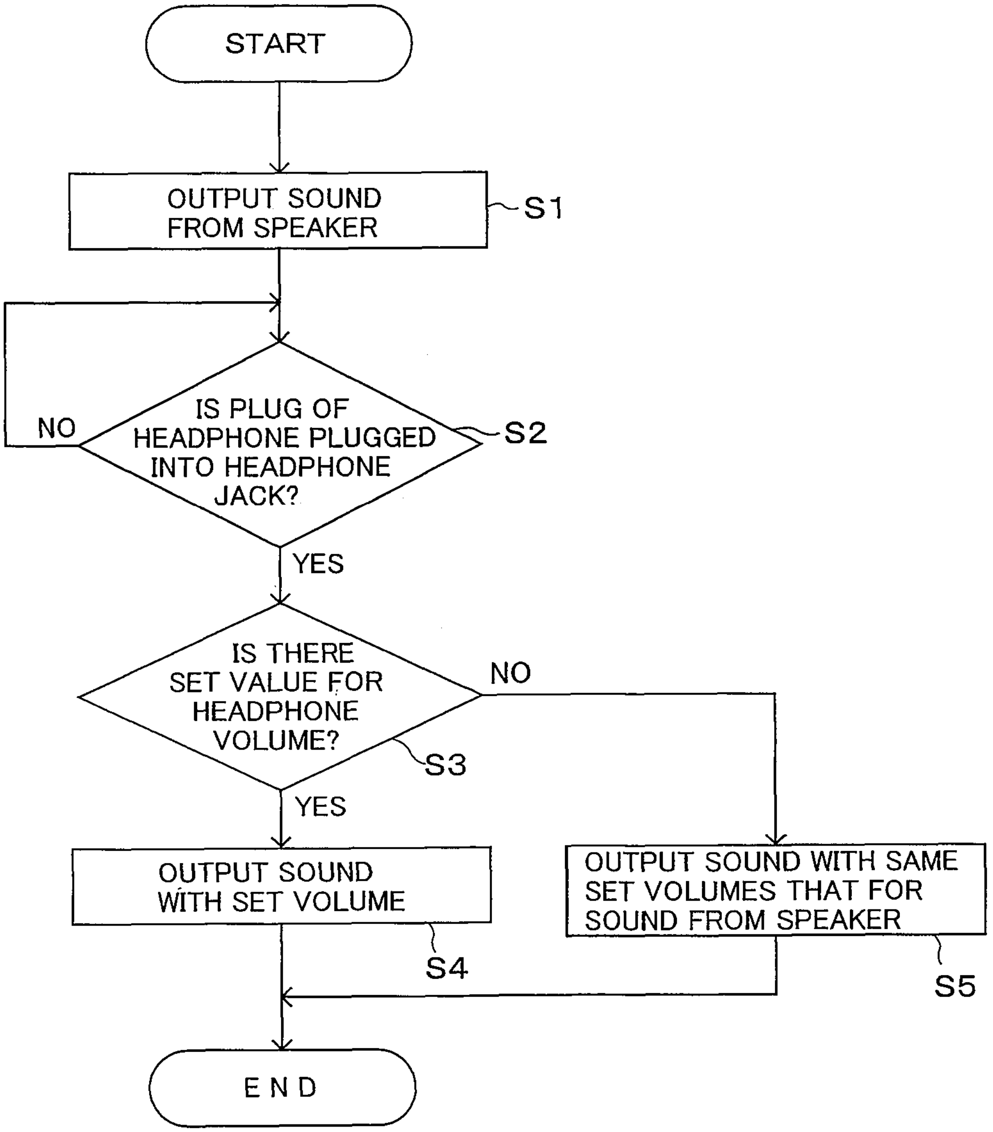
FIG. 13 is an exemplary first flow chart showing an operation of the portable electronic apparatus according to the embodiment of the invention.

FIG. 13 is a first flow chart showing an operation of the portable electronic apparatus according to the embodiment of the invention. The operation of the portable electronic apparatus according to the embodiment of the invention will be described in detail hereinafter with reference to the corresponding drawings.

Firstly, a sound is outputted from the speaker 11 of the portable electronic apparatus 1 (Step S1). In this case, it is assumed that music data is reproduced. When the plug of the headphone 2 is plugged into the headphone jack 133 during reproduction of the music data (Step S2: YES), the control portion 151 confirms whether or not the set value for the headphone volume is stored in the hard disc drive 148 by referring to the hard disc drive 148 (Step S3). When confirming that the set value for the headphone volume is stored in the hard disc drive 148 (Step S3: YES), the control portion 151 outputs a control signal to the sound outputting portion 146 so that the sound outputting portion 146 outputs a sound with a set volume in accordance with the control signal. The sound outputting portion 146 outputs the sound with the set volume to the headphone 2 (Step S4). On the other hand, when no plug of the headphone 2 is plugged into the headphone jack 133 during reproduction of the music data (Step S2: NO), the control portion 151 stands by in this situation.

On the other hand, when confirming that no set value for the headphone volume is stored in the hard disc drive 148 (Step S3: NO), the control portion 151 outputs a control signal to the sound outputting portion 146 so that the sound outputting portion 146 outputs a sound with the same volume as that with which the sound is outputted from the speaker 11 in accordance with the control signal. The sound outputting portion 146 outputs the sound with the same volume as that for the sound outputted from the speaker 11 to the headphone 2 (Step S5).

Figure 14:
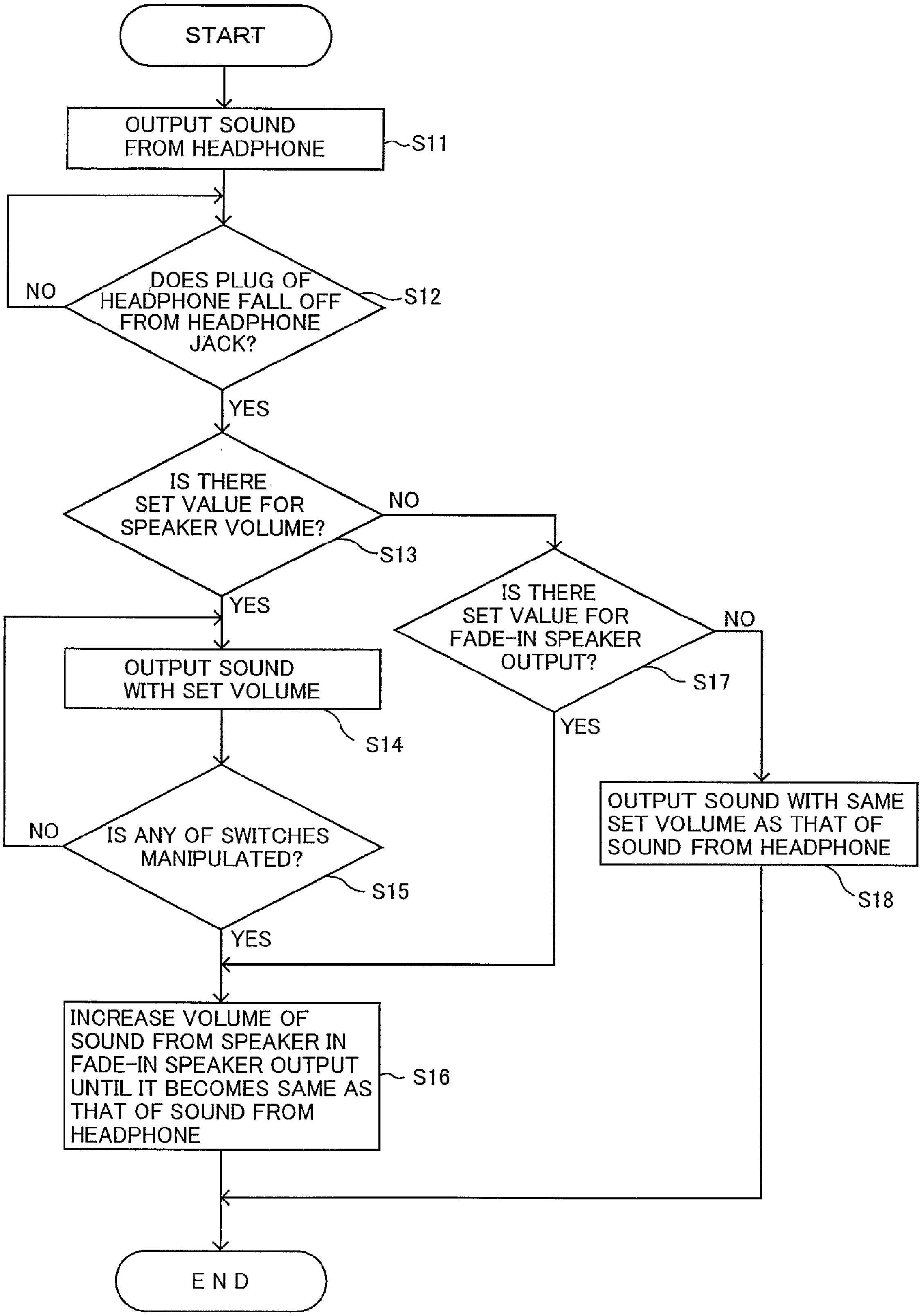
FIG. 14 is an exemplary second flow chart showing an operation of the portable electronic apparatus according to the embodiment of the invention.

FIG. 14 is a second flow chart showing the operation of the portable electronic apparatus according to the embodiment of the invention.

Firstly, a sound is outputted from the headphone 2 of the portable electronic apparatus 1 (Step S11). In this case, it is assumed that music data is reproduced. When the plug of the headphone 2 falls off from the headphone jack 133 during reproduction of the music data (Step S12: YES), the control portion 151 confirms whether or not the set value for the speaker volume is stored in the hard disc drive 148 by referring to the hard disc drive 148 (Step S13). When confirming that the set value for the speaker volume is stored in the hard disc drive 148 (Step S13: YES), the control portion 151 outputs a control signal to the sound outputting portion 146 so that the sound outputting portion 146 outputs a sound with a set volume in accordance with the control signal. The sound outputting portion 146 outputs the sound with the set volume to the speaker 11 (Step S14). On the other hand, when no plug of the headphone 2 falls off from the headphone jack 133 during reproduction of the music data (Step S12: NO), the control portion 151 stands by in this situation.

When the speaker volume based on the set volume is higher in level than the headphone volume, and the user manipulates any of the switches after the sound output is switched from the headphone 2 over to the speaker 11 (Step S15: YES), the volume of the sound from the speaker 11 is increased in the fade-in speaker output until it becomes the same volume as that of the sound from the headphone 2 (Step S16). When the user manipulates none of the switches (Step S15: NO), the operation returns back to the processing in Step S14, and the sound outputting portion 146 outputs the sound with the set volume from the speaker 11.

On the other hand, when confirming that no set value for the speaker volume is stored in the hard disc drive 148 (Step S13: NO), the control portion 51 confirms whether or not a set value for the fade-in speaker output is stored in the hard disc drive 148 by referring to the hard disc drive 148. When the control portion 51 confirms that the set value for the fade-in speaker output is stored in the hard disc drive 148 (Step S17: YES), the volume of the sound from the speaker 11 is increased in the fade-in speaker output until it becomes the same as that of the sound from the headphone 2 (Step S16).

On the other hand, when no set value for the fade-in speaker output is stored in the hard disc drive 148 (Step S17: NO), the control portion 151 outputs a control signal to the sound outputting portion 146 so that the sound outputting portion 146 outputs a sound with the same volume as that of the sound from the headphone 2 in accordance with the control signal. The sound outputting portion 146 outputs the sound with the same volume as that of the sound from the headphone 2 (Step S18).

According to the above-mentioned embodiment of the invention, the information on the use situation in which the user possessing the portable electronic apparatus 1 uses the portable electronic apparatus 1 is acquired by the illuminance sensor 12, the contact sensor 13 and the GPS portion 143 as use situation-acquiring portions. Also, the volume of the sound outputted either to the speaker 11 provided as the internal sound-outputting unit in the portable electronic apparatus 1 or to the external sound-outputting unit such as the headphone 2 is controlled in accordance with the information thus acquired. Therefore, even when the plug of the headphone 2 falls off from the headphone jack 133 of the portable electronic apparatus 1 despite an intention of the user, the unpleasant sound is prevented from being outputted from the speaker 11 to the circumference.

In addition, the control contents for the volume are previously set in accordance with the information, on the use situation of the portable electronic apparatus 1, acquired from the illuminance sensor 12, the contact sensor 13 and the GPS portion 143 which are described as the use situation-acquiring portions in the embodiment described above, which results in that the volume of the sound can be controlled in correspondence to the various use situations of the portable electronic apparatus 1.

Note that, the sound output-controlling function can be introduced to the portable electronic apparatus 1 not only by being used as a function previously incorporated in the apparatus main body 1A, but also by being down loaded as a sound output-controlling program to the portable electronic apparatus 1 in accordance with the selection made by the user.

It should be noted that the present invention is not limited to the embodiment described above, and the various combinations and changes may be made without departing from or changing the technical idea of the present invention.

What is claimed is:

1. A portable electronic apparatus, comprising:

a display portion arranged on a front surface of the apparatus;

a group of manipulating switches provided in the same surface as the display portion that includes at least a start switch with which a start image is displayed on the display portion, a back switch with which a picture displayed the last time by the last manipulation is displayed on the display portion, and a navigation switch with which desired ones of the menus and items displayed on the screen of the display portion are selected;

a GPS portion configured to be selectively activated or deactivated by a setting and upon activation, to provide area location information;

a contact sensor configured to detect contact with a user;

an illuminance sensor provided in the same surface as the display portion and configured to detect illuminance of an environment;

an antenna configured to receive a wireless signal bearing broadcast data;

a USB terminal;

a headphone jack configured to output a sound;

an MPEG decoder configured to generate a video signal and graphic data;

a speaker provided in the same surface as the display portion and configured to output a sound;

a storage portion configured to store applications including at least a sound output-controlling program, an operating system, or a driver group, the storage portion further comprising storing priority levels for the GPS portion, the contact sensor, and the illuminance sensor; and a control portion configured to execute the sound output-controlling program and control the outputting of sound in accordance with the detection of at least one of the GPS portion, the contact sensor, or the illuminance sensor;

wherein the control portion is further configured to control the outputting of sound based on the stored priority levels when two or more of the GPS portion, the contact sensor, or the illuminance sensor are detected, wherein when the luminance sensor detects luminance lower than a predetermined level, the control portion reduces sound volume level, and wherein the GPS portion provides area location information in which a first area is a silent area and a second area is a normal volume area, and if the control portion determines that the apparatus main body is located within the silent area and sound is outputted from the speaker and not from the headphone, the control portion controls a reduces sound volume level.

* * * * *